US005579319A

United States Patent [19]
Daniel

[11] Patent Number: 5,579,319
[45] Date of Patent: Nov. 26, 1996

[54] RECEIVER PATH SELECTION BASED ON BURST-TYPE IN A TIME DIVISION MULTIPLE ACCESS RECEIVER

[75] Inventor: Christopher J. Daniel, Lake Zurich, Ill.

[73] Assignee: Motorola, Inc., Schaumburg, Ill.

[21] Appl. No.: 310,613

[22] Filed: Sep. 22, 1994

[51] Int. Cl.⁶ ........................................ H04J 3/16
[52] U.S. Cl. .................. 370/95.3; 370/13; 455/234.1; 455/251.1
[58] Field of Search ........................ 370/95.3, 95.1, 370/85.7, 60, 13, 80, 38, 40, 98; 375/345, 279; 455/200.1, 234.1, 295, 232.1, 233.1, 251.1, 277.2

[56] References Cited

U.S. PATENT DOCUMENTS

| | | | |
|---|---|---|---|
| 4,635,247 | 1/1987 | Tejima | 370/13 |
| 5,184,349 | 2/1993 | Riordan | 370/95.3 |
| 5,204,976 | 4/1993 | Baldwin et al. | 455/234.2 |
| 5,245,611 | 9/1993 | Ling et al. | 370/100.1 |
| 5,321,690 | 6/1994 | Sato | 370/95.3 |
| 5,361,404 | 11/1994 | Dent | 455/135 |
| 5,426,642 | 6/1995 | Tanabe | 370/95.3 |

*Primary Examiner*—Wellington Chin
*Assistant Examiner*—Melissa Kay Carman
*Attorney, Agent, or Firm*—Richard A. Sonnnentag

[57] ABSTRACT

A TDMA receiver (100) has a limiting receiver path (116) for access bursts and a linear receiver path (117) for all other traffic and signalling bursts. Since the access bursts are not interleaved in typical TDMA digital cellular systems, such as the Global System for Mobile Communications (GSM) digital cellular system, the loss of amplitude information is not detrimental to acceptable access burst error rates in the TDMA receiver (100) implementation. The TDMA receiver (100) determines the burst-type (either through a priori knowledge of the burst-type or dynamic determination of the burst-type) and a selector switch (124) chooses which receiver path (116, 117) is to be demodulated.

24 Claims, 3 Drawing Sheets

RECEIVER PATH SELECTION BASED ON BURST-TYPE IN A TIME DIVISION MULTIPLE ACCESS RECEIVER

FIELD OF THE INVENTION

The invention relates generally to receivers in communication systems, and more particularly to receivers which receive bursts in time division multiple access communication systems.

BACKGROUND OF THE INVENTION

Analog cellular systems use frequency modulation (FM) to transmit information which allows the use of cost-effective receivers employing limiting and frequency discrimination. With the advent of digital cellular systems, receiver designs are complicated by the need to have a wide dynamic range, linear receiver with channel equalization to attain the highest level of performance. This typically requires more costly implementations than receivers used in analog cellular systems.

In a time division multiple access (TDMA) digital cellular system, traffic and signalling information is transmitted in bursts (normal bursts) during timeslots of periodic intervals. Multipath fading will introduce transmission errors in some of these bursts, which is mitigated through the use of interleaving and coding. These bursted error events can most effectively be dealt with by applying soft decision information to the decoding process. To generate soft decision information, the variations in received amplitude should ideally be preserved for each interleaved burst to assist in channel equalization and subsequent decoding. This is typically accomplished through the use of a linear receiver covering the full faded dynamic range.

When a mobile requires access to a TDMA digital cellular system, it transmits an access burst to the system to request such access. The duration of the access burst is shortened relative to the normal bursts (traffic and signalling) to compensate for the time delay between a mobile's transmission of the access burst and a base-station's reception of the access burst. The access burst is a one-time event and, thus, the data need not be (and is not) interleaved. The access burst coding does, however, provide some means of combating fading.

Typical receiver designs in TDMA digital cellular systems implement common automatic gain control (AGC) elements for all burst-types. AGC on the access burst is treated differently from the normal bursts in the linear receiver by performing a fast AGC operation on the access burst. In this configuration, the linear receiver must determine when a mobile is on channel, estimate its signal strength, and set/hold the AGC for the remainder of the access burst. This method requires a very fast signal strength indicator (SSI) circuit and a threshold indicator to sense the presence of a mobile attempting access to the system. AGC on normal bursts is done by using an algorithm which employs a long term averaging component and a short term signal strength component. In both cases, as stated above, common AGC elements are used and their settings held through the timeslot.

The fast AGC method described above has several limitations: (1) memory is required to store values which map the raw signal strength indication to a gain setting, (2) the SSI must be very fast to track the mobile transmission's turn-on characteristic, and (3) there is some probability that an incorrect AGC setting will be made during the access burst. This is probable because the longer a mobile's transmission is delayed, the greater the likelihood that a noise burst or an interfering signal will cause a false detection of a mobile's presence. If the AGC setting is based on the signal strength of this noise or interference, a delayed mobile transmission may be received later in the timeslot which is well outside the A/D converter's window. In rural installations which may have extended cells up to 120 km, two adjacent timeslots could be used for the access burst. In this case, there is a greater probability of a false AGC setting due to a noise burst or an interfering signal crossing the presence threshold.

Thus, a need exists for a receiver architecture which is capable of receiving access, traffic and signalling bursts while overcoming the above described limitations.

DETAILED DESCRIPTION OF A PREFERRED EMBODIMENT

Figure 1:
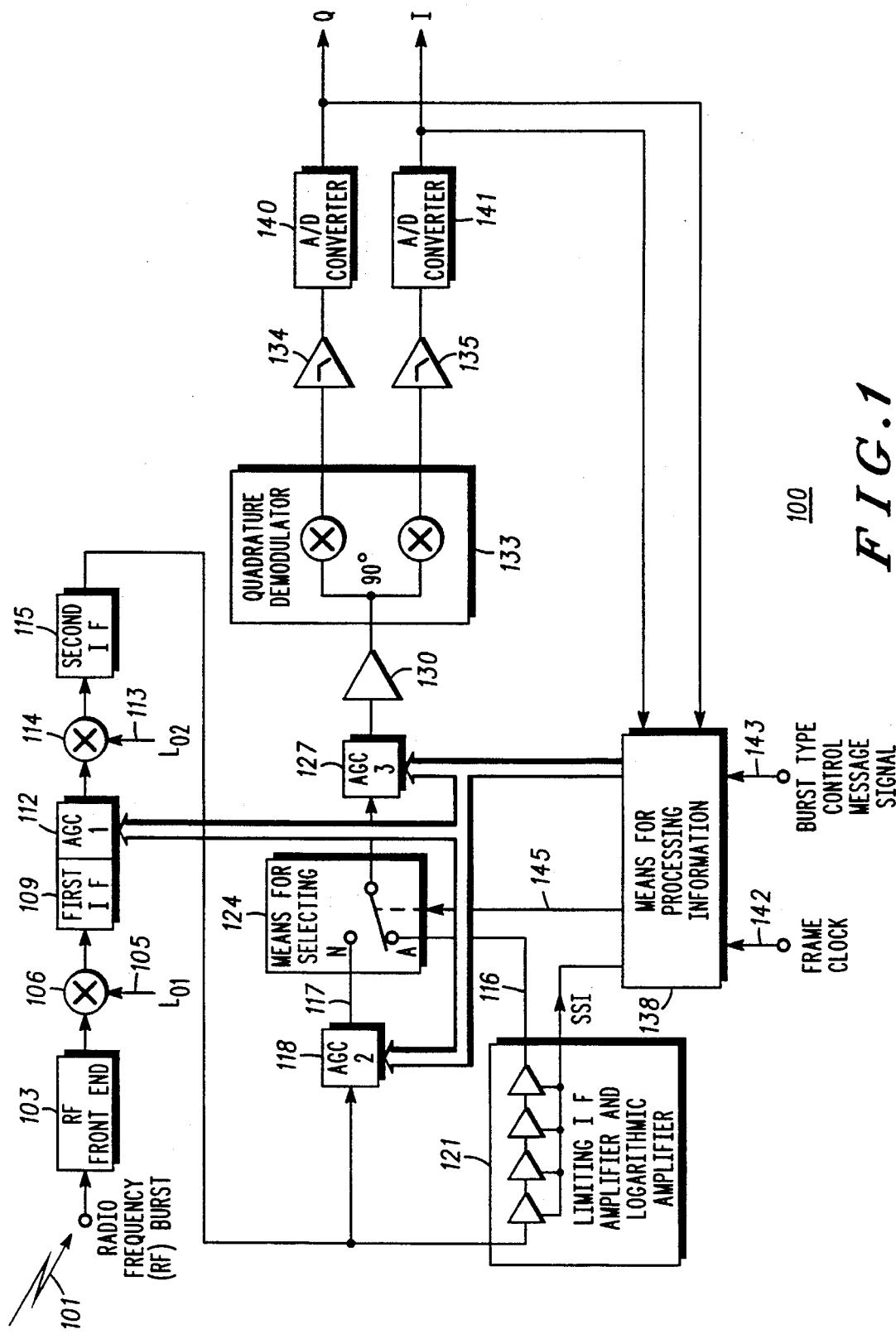
FIG. 1 generally depicts a receiver which selects a receiver path based on burst-type in accordance with the invention.

An access burst is a burst transmitted from a mobile station to a base-station to request access to the particular time division multiple access (TDMA) communication system of interest. Since the access bursts are not interleaved in typical TDMA digital cellular systems, such as the Global System for Mobile Communications (GSM) digital cellular system, the loss of amplitude information is not detrimental to acceptable access burst error rates in a TDMA receiver implementation. Therefore, a TDMA receiver can be designed to have a limiting receiver path for access bursts and a linear receiver path for all other traffic and signalling bursts. Since the base-station receiver can determine the burst-type (either through a priori knowledge of the burst-type or dynamic determination), a selector switch can choose which receiver path is to be demodulated. The appropriate path can be selected during the guard period between bursts, which is adequate in most systems (30 microseconds in GSM) so that the selector switching speed is not an issue. This receiver architecture, further described below, overcomes the above-described limitations.

This invention uses the combination of a high gain limiting receiver for access bursts, a linear receiver implementing AGC for normal bursts (traffic and signalling bursts), and a selector switch to determine which path is to be demodulated for subsequent decoding. The invention is applicable to any TDMA communication system which employs channel types having interleaved and non-interleaved bursts.

In general terms, the inventive time division multiple access (TDMA) receiver 100 comprises a means for processing information 138 related to a type of burst to be received and a means for selecting 124 a first receiver path 116 or second receiver path 117 to receive the burst based on the determined burst-type. In the preferred embodiment, the means for processing information processes information that is input from a burst-type control message signal 143. The information input from the burst-type control message signal 143 provides the receiver 100 with a priori knowledge of reception of a particular burst-type (i.e., an access burst or a normal burst). The a priori knowledge is based on a timeslot in which reception of the burst-type may occur. In an alternate embodiment which may not employ a priori knowledge, the means for processing information may process information input from burst detection circuitry 503 which dynamically determines the burst-type received.

In the preferred embodiment, the first receiver path comprises circuitry for use in a limiting receiver path when the type of burst is an access burst. The limiting receiver path does not implement automatic gain control (AGC). Likewise in the preferred embodiment, the second receiver path comprises circuitry for use in a linear receiver path employing AGC when the type of burst is a normal burst (i.e., inter alia, a traffic or signalling burst).

FIG. 1 generally depicts a receiver 100 which selects a receiver path based on burst-type in accordance with the invention. As depicted in FIG. 1, a radio frequency (RF) burst 101 is input into an RF front-end 103, which in the preferred embodiment is a filter having the band pass characteristics of the desired communication system. Output from front-end 103 is input into a mixer 106 which also has as input a local oscillator (LO) signal LO1 105. Mixer 106 converts signal 101 to an intermediate frequency (IF) which is then input into first IF block 109. Depending on the type of burst to be received, AGC1 112 may or may not provide automatic gain control (AGC) on a signal exiting block 109. Continuing, the subsequent signal exiting block 112 is input into a second mixer 114 which likewise has as input a second LO signal LO2 113. The signal exiting mixer 114 is input into a second IF 115. First IF 109 and second IF 115 perform narrowband filtering and amplification.

The signal exiting block 115 will travel down both a first receiver path 116 and a second receiver path 117. The first receiver path 116 includes a limiting IF amplifier and logarithmic amplifier 121 which performs limiting receiver-type functions and signal strength indication (SSI), which are well-known in the art. On the other hand, the second receiver path 117 includes automatic gain control circuitry AGC2 118. Means for processing information 138 processes information related to the burst-type to be received by quadrature demodulator 133. Means for processing 138 processes information input from a burst-type control message signal 143 which provides receiver 100 with a priori knowledge of reception of a particular burst-type. Also input into means for processing 138 is a frame clock 142 which provides the requisite clocking information. Continuing, the a priori knowledge of reception of a particular burst-type is based on a timeslot in which reception of a particular burst-type may occur.

Based on the information, means for processing information 138 will toggle means for selecting 124 accordingly via control signal 145. For example, if the burst-type is an access burst, means for selecting 124 is switched to position "A" and first receiver path 116 is eventually demodulated by quadrature demodulator 133. If, on the other hand, the burst is a normal burst (i.e., a traffic [TCH] or a signaling burst), means for selecting 124 is switched to "N" and the second receiver path 117 is eventually demodulated by quadrature demodulator 133. Output from quadrature demodulator 133, in either event, is input into filters 134 and 135 which eventually output in phase ("I") and quadrature phase ("Q") components of the original signal 101. The "I" and "Q" components are converted from analog signals to digital samples by analog-to-digital converters (A/Ds) 140, 141, and are further processed by circuitry not shown in FIG. 1 and circuitry not considered relevant to the inventive receiver 100 depicted in FIG. 1. Signals output from A/Ds 140, 141 are input into means for processing information 138 for use in the TCH/signalling control loop which determines the normal burst AGC setting..

Figure 2:
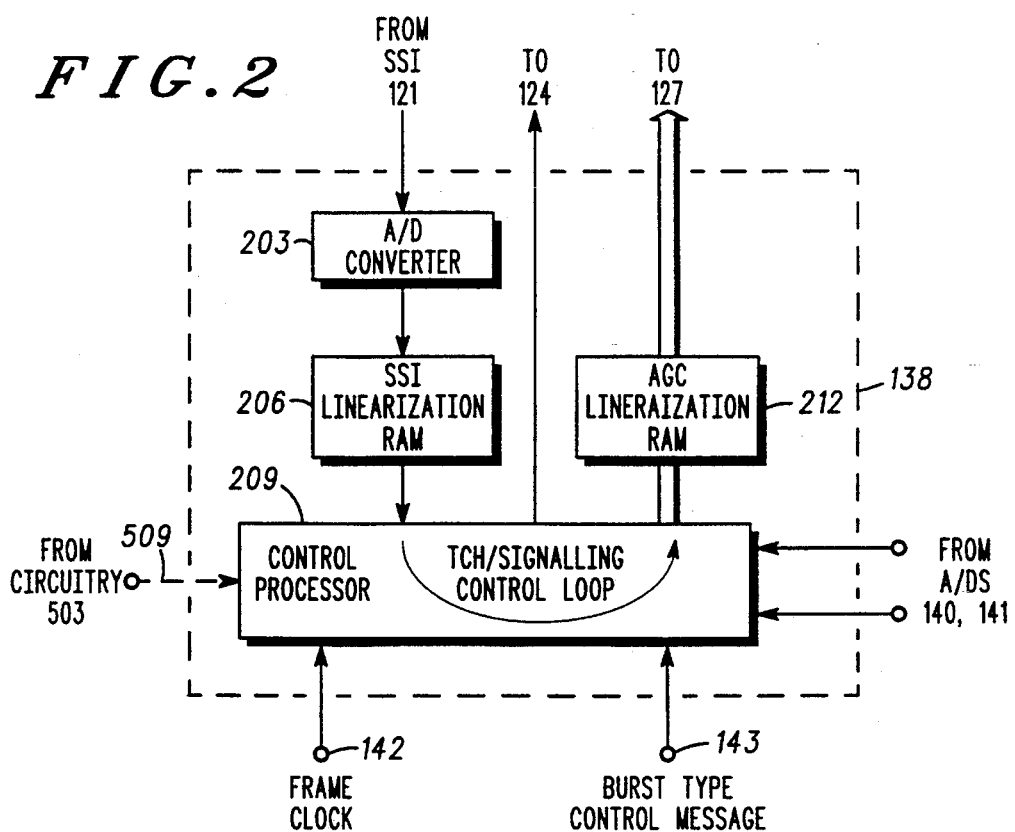
FIG. 2 generally depicts means for processing information related to burst-type in accordance with the invention.

FIG. 2 generally depicts means for processing information 138 in accordance with the invention. As depicted in FIG. 2, a signal strength indication (SSI) from block 121 is input into an analog-to-digital (A/D) converter 203 which converts the analog SSI into digital samples. The digital samples are input into a SSI linearization random access memory (RAM) 206. RAM 206 compensates for non-linearities in the SSI response. The output from RAM 206 is input into control processor 209 which provides, inter alia, a traffic channel (TCH) and signaling channel control loop for automatic gain control (AGC) settings for AGC1 112, AGC2 118 and AGC3 127. AGC information is provided to these elements via AGC linearization RAM 212 which compensates for non-linearities in AGC elements 112, 118 and 127. Control processor 209 also has as inputs the output from A/Ds 140, 141.

Control processor 209 also provides information to means for selecting 124 to switch between first receiver path 116 and second receiver path 117. The information processed by control processor 209 is obtained a priori to reception of the burst. In other words, control processor 209 has knowledge of whether an access burst or a normal burst (TCH/signaling burst) is to be received. As stated above, this knowledge is based on a timeslot in which reception of the burst occurs. Since control processor 209 knows the order of timeslots as they are received, control processor 209 is able to appropriately switch means for selecting 124 when a timeslot in which an access burst occurs is received. When other timeslots for receiving normal bursts occur, control processor 209 toggles means for selecting 124 to the "N" position, which in the preferred embodiment will receive these normal bursts via a linear receiver.

Figure 3:
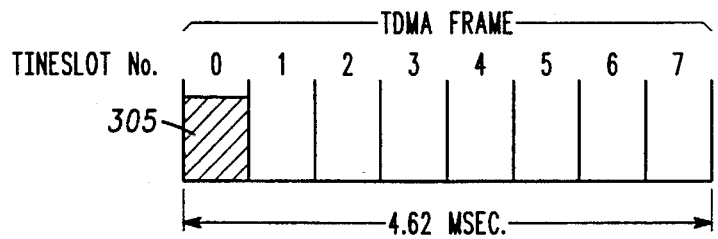
FIG. 3 generally depicts a TDMA frame received by the receiver of FIG. 1 in accordance with the invention.
Figure 4:
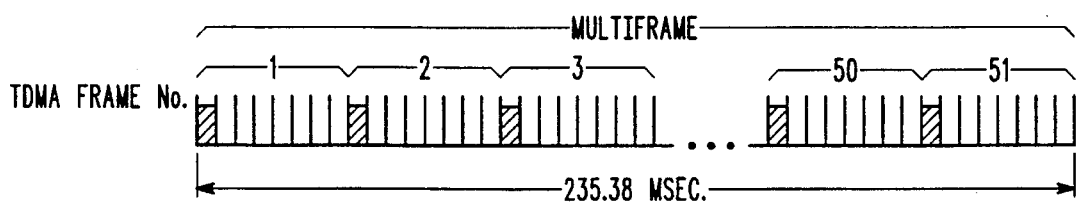
FIG. 4 generally depicts a TDMA multiframe received by the receiver of FIG. 1 in accordance with the invention.

As previously stated, control processor 209 has a priori knowledge of the timeslot structure because the time division multiple access (TDMA) frame has the predetermined structure as shown in FIG. 3. As depicted in FIG. 3, a TDMA frame of 4.62 milliseconds (msec) duration, and having a timeslot (0–7) is shown. For every time division multiplexed (TDM) frame, timeslot No. 0 is the only slot in which an access burst may be received. Consequently, control processor 209, having this knowledge, will only toggle means for selecting 124 to the "A" position during timeslot 0 of a TDM frame. FIG. 4 generally depicts a multiframe consisting of 51 TDM frames as defined by the European Telecommunications Standard Institute (ETSI) specification titled "Multiplexing and Multiple Access on the Radio Path" (GSM 05.02). As depicted, a multiframe has a 235.38 msec duration and repeats every 51 TDMA frames. While timeslot 0 of each frame is shown having a burst signal therein, an access burst need not (and may not) exist in every timeslot 0 of every TDMA frame. The pre-determined manner in which an access burst may be received by receiver 100 is described in GSM 05.02.

While the invention has been described in conjunction with specific embodiments thereof, it is evident that many alterations, modifications and variations will be apparent to those skilled in the art in light of the foregoing description.

Figure 5:
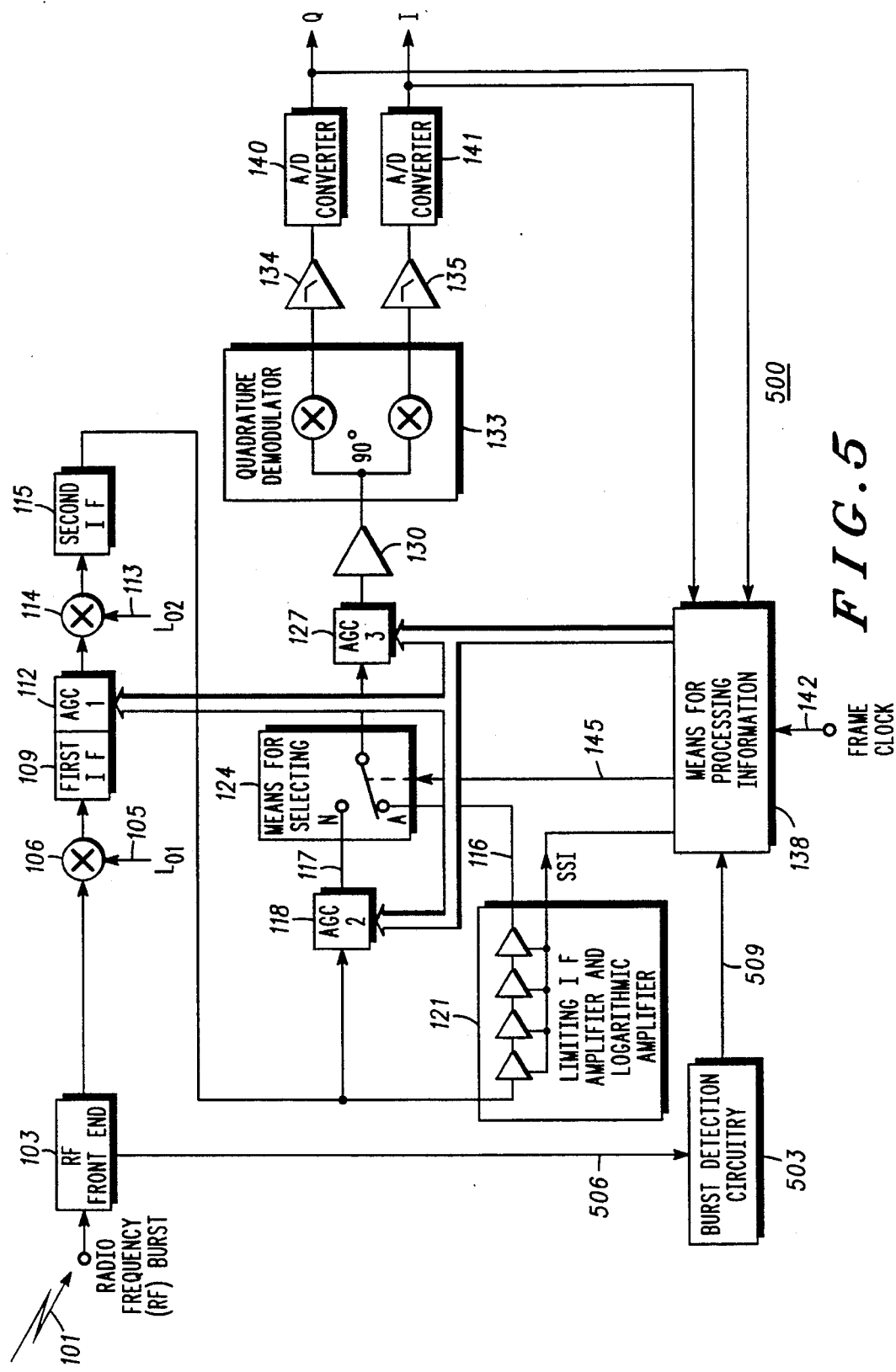
FIG. 5 generally depicts an alternate embodiment of a receiver which selects a receiver path based on burst-type in accordance with the invention.

For example, FIG. 5 generally depicts an alternate embodiment of a receiver 500 which selects a receiver path 116, 117 based on burst-type in accordance with the invention. In FIG. 5, burst detection circuitry 503 is utilized to dynamically determine the burst-type received by receiver 500 by detecting the burst-type received via first signal 506. This determined information is input into means for processing 138 via a second signal 509, and toggling of means for selecting 124 is accomplished as described above. In this embodiment, second signal 509 is input into control processor 209 of FIG. 2 (denoted by the dotted line entering control processor 209 in FIG. 2). Important to note is that this embodiment does not require means for processing 138 to have a priori knowledge of the burst-type to be received (i.e., burst-type control message signal 143 is not required). While a single alternate embodiment has been described, the appended claims are intended to embrace any alterations, modifications, and variations of receiver path selection based on burst-type in accordance with the invention.

What I claim is:

1. A time division multiple access (TDMA) receiver comprising:

means for processing information related to a burst-type to be received; and means for selecting a first or second receiver path to receive the burst based on the determined burst-type.

2. The TDMA receiver of claim 1 wherein the means for processing information further comprises means for processing information input from a burst-type control message signal.

3. The TDMA receiver of claim 2 wherein the means for processing information input from a burst-type control message Signal provides the receiver with a priori knowledge of reception of a particular burst-type.

4. The TDMA receiver of claim 3 wherein the a priori knowledge of reception of a particular burst-type is based on a timeslot in which reception of a particular burst-type may occur.

5. The TDMA receiver of claim 1 wherein the means for processing information further comprises means for processing information input from burst detection circuitry which dynamically determines the burst-type received.

6. The TDMA receiver of claim 1 wherein the first receiver path further comprises circuitry for use in a limiting receiver path when the burst-type is an access burst.

7. The TDMA receiver of claim 6 wherein the limiting receiver path does not implement automatic gain control (AGC).

8. The TDMA receiver of claim 1 wherein the second receiver path further comprises circuitry for use in a linear receiver path when the burst-type is a traffic or signalling burst.

9. A receiver for use in a time division multiple access (TDMA) communication system, the system employing access bursts in predetermined timeslots, the receiver comprising:

a first receiver path for receiving the access bursts in the predetermined slots; and a second receiver path for receiving other bursts in other slots.

10. The receiver of claim 9 wherein the first receiver path further comprises a limiting receiver path.

11. The receiver of claim 10 wherein the limiting receiver path does not implement automatic gain control (AGC).

12. The receiver of claim 9 wherein the second receiver path further comprises a linear receiver path incorporating automatic gain control (AGC).

13. The receiver of claim 9 wherein the other bursts further comprise traffic or signalling bursts.

14. A method of receiver path selection in a time division multiple access (TDMA) receiver, the method comprising the steps of:

processing information related to a burst-type to be received; and selecting a first or second receiver path to receive the burst based on the determined burst-type.

15. The method of claim 14 wherein the step of processing information further comprises the step of processing information input from a burst-type control message signal.

16. The method of claim 15 wherein the step of processing information input from a burst-type control message provides the receiver with a priori knowledge of reception of a particular burst-type.

17. The method of claim 16 wherein the a priori knowledge of reception of a particular burst-type is based on a timeslot in which reception of a particular burst-type may occur.

18. The method of claim 14 wherein the step of processing information further comprises the step of processing information input from burst detection circuitry which dynamically determines the burst-type received.

19. The method of claim 14 wherein the first receiver path further comprises circuitry for use in a limiting receiver path when the burst-type is an access burst.

20. The method of claim 19 wherein the limiting receiver path does not implement automatic gain control (AGC).

21. The method of claim 14 wherein the second receiver path further comprises circuitry for use in a linear receiver path when the burst-type is a traffic or signalling burst.

22. A time division multiple access (TDMA) receiver comprising:

burst detection circuitry for determining information related to a burst-type received;

means, coupled to the burst detection circuitry, for processing the determined information related to the burst-type received; and means, coupled to the means for processing, for selecting a first or second receiver path to receive the burst based on the determined burst-type received.

23. A time division multiple access (TDMA) receiver comprising:

a processor having as input a burst-type control message signal and outputting a control signal, the output control signal related to burst-type information contained within the burst-type control message signal; and a switch having as input the control signal, a first receiver path and a second receiver path and outputting information from one of the first receiver path or the second receiver path based on the control signal.

24. A time division multiple access (TDMA) receiver comprising:

burst detection circuitry having as input a first signal and outputting a second signal related to determined burst-type information;

a processor having as input the second signal and outputting a control signal, the output control signal related to the determined burst-type information contained within the second signal; and a switch having as input the control signal, a first receiver path and a second receiver path and outputting information from one of the first receiver path or the second receiver path based on the control signal.

* * * * *